(12) United States Patent
Zhao et al.

(10) Patent No.: US 11,535,041 B2
(45) Date of Patent: Dec. 27, 2022

(54) INK FOR PRODUCING LASER LIGHT SOURCESY

(71) Applicant: INSTITUTE OF CHEMISTRY, CHINESE ACADEMY OF SCIENCES, Beijing (CN)

(72) Inventors: Yongsheng Zhao, Beijing (CN); Jiannian Yao, Beijing (CN); Jinyang Zhao, Beijing (CN); Yongli Yan, Beijing (CN)

(73) Assignee: INSTITUTE OF CHEMISTRY, CHINESE ACADEMY OF SCIENCES, Beijing (CN)

( * ) Notice: Subject to any disclaimer, the term of this patent is extended or adjusted under 35 U.S.C. 154(b) by 526 days.

(21) Appl. No.: 16/614,769

(22) PCT Filed: May 4, 2018

(86) PCT No.: PCT/CN2018/085672
§ 371 (c)(1),
(2) Date: Nov. 18, 2019

(87) PCT Pub. No.: WO2018/210144
PCT Pub. Date: Nov. 22, 2018

(65) Prior Publication Data
US 2020/0172750 A1 Jun. 4, 2020

(30) Foreign Application Priority Data

May 19, 2017 (CN) .......................... 201710358465.8
May 19, 2017 (CN) .......................... 201710358471.3
(Continued)

(51) Int. Cl.
*C09D 11/328* (2014.01)
*B41M 5/00* (2006.01)
(Continued)

(52) U.S. Cl.
CPC ............... *B41J 2/442* (2013.01); *B41J 3/546* (2013.01); *B41M 3/006* (2013.01);
(Continued)

(58) Field of Classification Search
CPC .......... B41J 2/442; B41J 3/546; B41M 3/006; B41M 5/0023; B41M 5/0047;
(Continued)

(56) References Cited

U.S. PATENT DOCUMENTS 8,042,899 B2 10/2011 Folkins et al.
8,714,692 B1 5/2014 Metcalfe et al.
(Continued)

FOREIGN PATENT DOCUMENTS

CN 1297671 A 5/2001
CN 102566214 A 7/2012
(Continued)

*Primary Examiner* — Yaovi M Ameh
(74) *Attorney, Agent, or Firm* — Novick, Kim & Lee, PLLC; Allen Xue

(57) ABSTRACT

Ink for producing laser light sources. The ink is used for inkjet printing to produce laser light sources of a certain scale. The ink comprises a luminescent dye, a host material, and a solvent. The use of the ink makes it possible to produce laser light sources through inkjet printing. This provides a novel technical solution for cheap and industrial manufacturing of laser light sources and other related products through inkjet printing.

12 Claims, 1 Drawing Sheet

(30) Foreign Application Priority Data

| | | |
|---|---|---|
| May 19, 2017 | (CN) | 201710359070.X |
| May 19, 2017 | (CN) | 201710359076.7 |
| May 19, 2017 | (CN) | 201710359566.7 |
| May 19, 2017 | (CN) | 201710359567.1 |
| May 19, 2017 | (CN) | 201710359582.6 |
| May 19, 2017 | (CN) | 201710361265.8 |

(51) Int. Cl.

| | |
|---|---|
| *B41J 2/44* | (2006.01) |
| *B41J 3/54* | (2006.01) |
| *C09D 11/107* | (2014.01) |
| *C09D 11/108* | (2014.01) |
| *H01S 5/36* | (2006.01) |
| *H01S 5/40* | (2006.01) |
| *B41M 3/00* | (2006.01) |
| *G09G 3/02* | (2006.01) |
| *H01S 3/16* | (2006.01) |
| *G03B 21/20* | (2006.01) |
| *C09D 11/50* | (2014.01) |
| *C09D 11/102* | (2014.01) |
| *C09D 11/106* | (2014.01) |

(52) U.S. Cl.
CPC ......... *B41M 5/0023* (2013.01); *C09D 11/107* (2013.01); *C09D 11/108* (2013.01); *C09D 11/328* (2013.01); *G03B 21/2033* (2013.01); *G09G 3/02* (2013.01); *H01S 3/168* (2013.01); *H01S 5/36* (2013.01); *H01S 5/4093* (2013.01); *B41M 5/0047* (2013.01); *C09D 11/102* (2013.01); *C09D 11/106* (2013.01); *C09D 11/50* (2013.01)

(58) Field of Classification Search
CPC ... C09D 11/107; C09D 11/108; C09D 11/328; C09D 11/102; C09D 11/106; G09G 3/02; H01S 5/36; H01S 5/4093; H01S 3/168; H01S 3/0627; H01S 3/094034; H01S 3/2391; H01S 3/23; G02B 27/48; G03B 21/2033

See application file for complete search history.

(56) References Cited

U.S. PATENT DOCUMENTS

| | | |
|---|---|---|
| 8,955,937 B2 | 2/2015 | Metcalfe et al. |
| 8,985,723 B2 | 3/2015 | Metcalfe et al. |
| 9,573,382 B1 | 2/2017 | Metcalfe et al. |

FOREIGN PATENT DOCUMENTS

| | | | | |
|---|---|---|---|---|
| CN | 102906199 A | | 1/2013 | |
| CN | 104619794 A | * | 5/2015 | ............... B41J 2/01 |
| CN | 104619794 A | | 5/2015 | |
| CN | 105699330 A | | 6/2016 | |
| JP | 4345278 B2 | * | 10/2009 | ........... C23C 14/042 |
| WO | 2016039259 A1 | | 3/2016 | |

* cited by examiner

INK FOR PRODUCING LASER LIGHT SOURCESY

TECHNICAL FIELD

The present invention belongs to the field of laser, and relates to an ink for producing laser sources.

BACKGROUND ART

For the field of laser, on the one hand, the current laser display technology, due to laser speckles caused by interference effects of strong coherence of laser which seriously reduces display quality, has to use vibrating screen to eliminate speckles. On the another hand, in the prior art, there is a lack of technology for fast and mass-manufacturing of laser sources and enabling each point in each laser sources to emit laser in different colors. However, in the prior art, there is also a lack of technical solutions for fast and mass-manufacturing of laser sources.

DETAILED DESCRIPTION OF THE INVENTION

To solve the above problems, the present invention provides an ink for producing laser sources, which it realizes to produce laser sources through inkjet printing, providing a new technical solution for the cheap and industrial manufacturing of laser sources and other related products.

An ink for producing laser sources, wherein, the ink is used to produce laser sources through inkjet printing;

the ink comprises a luminescent dye, a matrix material and a solvent.

Preferably, the luminescent dye comprises: photoinduced laser dyes, electroluminescent laser dyes, or their mixtures.

Preferably, the laser sources comprise RGB three light sources.

Preferably, the luminescent dye comprises: a blue-emitting oligostyrene dye, a green-emitting coumarin dye, a rhodamine series of dye, or a red-emitting hemicyanine dye, or their mixtures. For example, Coumarin 153, or Coumarin 6 or Rhodamine 6G dye.

More preferred luminescent dye comprises three laser dyes, namely symmetrical diphenylethylene, fluorescein sodium, rhodamine B, and their mixtures, the most preferably the mixtures of the three.

Preferably, the matrix material comprises: polystyrene, polymethyl methacrylate, NOA series of light curable materials or their mixtures.

Preferably, the ink uses water, dichloromethane, chloroform, dimethylformamide or their mixtures as a solvent.

Preferable, the ink can be any one of the following formulations: three laser dyes, namely symmetrical diphenylethylene, fluorescein sodium and rhodamine B, are added into a BSA aqueous solution of 300-1000 mg/mL respectively, in which a mass ratio of one of the three dyes to BSA are 1-3%, respectively, and then glycerol is added. A volume ratio of glycerol to water is 1:1-4, preferably 1:2;

more preferable, the ink can be any one of the following formulations:

(1) three laser dyes, namely symmetrical diphenylethylene, fluorescein sodium and rhodamine B, are added into a BSA aqueous solution of 400 mg/mL, respectively, in which a mass ratio of one of the three dyes to BSA are all 1%. Finally, glycerol is added, in which a volume ratio of glycerol to water is 1:2;

(2) three laser dyes, namely symmetrical diphenylethylene, fluorescein sodium and rhodamine B, are added into a BSA aqueous solution of 800 mg/mL, respectively, in which a mass ratio of one of the three dyes to BSA are all 1%. Finally, glycerol is added, in which a volume ratio of glycerol to water is 1:2;

(3) three laser dyes, namely symmetrical diphenylethylene, fluorescein sodium and rhodamine B, are added into a BSA aqueous solution of 500 mg/mL, respectively, in which a mass ratio of diphenylethylene, fluorescein sodium and rhodamine B to BSA are 2%, 2%, and 1%, respectively. Finally, glycerol is added, in which a volume ratio of glycerol to water is 1:2.

Preferably, the scale of the laser sources comprises any one of the following: millimeter, micrometer or even smaller.

Preferably, the fabricated laser sources can be combined into multiple independent laser source modules; in each of multiple independent laser source modules, at least two of the light sources are capable of emitting light in different colors under the same excitation conditions.

Preferably, the ink also comprises an auxiliary material, which comprises liquid prepolymer.

Preferably, the ink also comprises an auxiliary material, which comprises any one of the following: heat curable epoxy resins, NOA series of light curable adhesives.

According to many technical solutions provided by the present invention, it realizes to produce laser sources through inkjet printing, which provides a new technical solution for the cheap and industrial manufacturing of laser sources and other related products.

EMBODIMENTS

To help those skilled in the art understand the technical solutions disclosed in the present invention, hereinafter, with reference to the embodiments and the accompanying drawings, the technical solution of every embodiment is described. The described embodiments are a part of the embodiments of the present invention, rather than all of the embodiments. Furthermore, the terms such as "first", "second", etc., in the present invention are used to distinguish different objects, and not meant to describe a specific order. Moreover, "including" and "having" and any variations thereof are intended to be inclusive and not exclusive. For example, processes, methods, systems, products, or devices that include a series of steps or units are not limited to include the listed steps or units, but optionally include unlisted steps or units, or optionally also include other inherent steps or units in these processes, methods, systems, products, or devices.

"Embodiments" mentioned herein mean that the accompanying specific features, structures, or characteristics described in the embodiments can be included in at least one embodiment of the present invention. The phrase appearing in various places in the description is neither necessarily referred to the same embodiments, nor independent or alternative embodiments that are mutually exclusive from other embodiments. Those skilled in the art can understand that the embodiments described herein can be combined with other embodiments.

Figure 1:
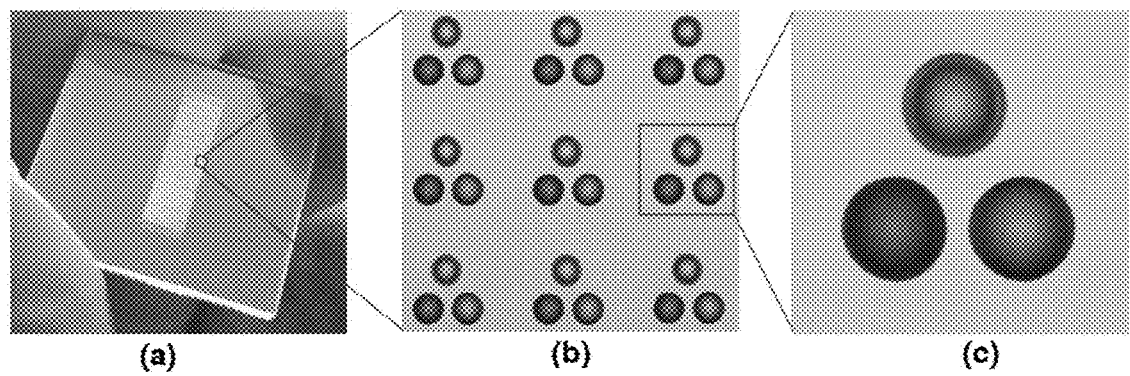
FIG. 1 is a schematic view of laser sources fabricated with an ink in an embodiment of the present invention.

Referring to FIG. 1, the plural light sources are shown. The light sources are all fabricated with an ink of the present invention, wherein, the ink is used to produce laser sources through inkjet printing;

the ink comprises a luminescent dye, a matrix material and a solvent.

For the embodiments, the disclosed ink makes it a reality to produce laser sources through inkjet printing, which provides a new technical solution for the cheap and industrial manufacturing of laser sources and other related products.

In another embodiment, the luminescent dye comprises any one of the following: photoinduced laser dyes, electroluminescent laser dyes.

On the one hand, in the field of materials, there are photoinduced laser dyes, and also electroluminescent laser dyes. This provides many choices of luminescent dyes for those skilled in the art. On the other hand, if photoinduced laser dyes are used, the laser sources produced through inkjet printing mentioned above can be excited by other light, such as femtosecond lasers; understandably, the parameters selection of the corresponding femtosecond lasers is related to the characteristics of the light sources themselves formed after the ink is cured, especially the absorption spectra; if electroluminescent laser dyes are used, the laser sources can be excited by applying a voltage, such as a DC voltage or a pulse voltage; as an example, by virtue of the above-mentioned embodiment, those skilled in the art easily obtain by selecting dyes: a laser source that can be excited by applying a DC voltage of 3V. Depending on the materials, DC voltage may be changed to pulse voltage as needed. The pulse frequency and amplitude can match the refresh rate required for display.

In another embodiment, the ink also comprises an auxiliary material. If the auxiliary material is included, it not only helps to reduce the volatility of the solvent, but also ensures that the ink is not solidified in the printing process.

In particular, the auxiliary material may not be needed. Since it is impossible to record all ink formulations, those skilled in the art can foresee that: in some formulation, an auxiliary material may not be needed, as long as an solvent and a luminescent dye are properly selected, which still ensures that the volatility of the solvent is not obvious and the ink is not easy to be solidified, i.e., in the absence of the auxiliary material, it is possible that the inkjet printing process is basically unaffected by curing.

In another embodiment, the luminescent dye comprises: a blue-emitting oligostyrene dye, a green-emitting coumarin dye, a rhodamine series of dye, or a red-emitting hemicyanine dye, or their mixtures. For example, Coumarin 153, or Coumarin 6 or Rhodamine 6G dye.

More preferred luminescent dye comprises three laser dyes, namely symmetrical diphenylethylene, fluorescein sodium, rhodamine B, and their mixtures, the most preferably the mixtures of the three.

For those skilled in the art, according to the requirement of luminescence colors, a dye with a corresponding emission wavelength can be selected. In addition, the luminescent dye can also be selected from blue-emitting oligostyrene dyes, or green-emitting coumarin dyes such as coumarin 153, or coumarin 6, etc., or rhodamine series of dyes such as rhodamine 6G, etc., or red-emitting hemicyanine dyes. Since the embodiment realizes three light of red, green and blue, it is easy to use the ink to produce an RGB laser source.

In another embodiment, the matrix material comprises: polystyrene, polymethyl methacrylate, NOA series of light curable materials or their mixtures.

For the embodiment, the matrix material is used as a support material for the laser cavity, which is compatible with the laser dyes. Understandably, the better the material compatibility, the more suitable it is to be used as a matrix material. As can be seen, if the matrix material has good processability, it is also very advantageous.

In another embodiment, the ink uses water, dichloromethane, chloroform, dimethylformamide or their mixtures as a solvent. As can be seen, the embodiment is an example to provide a range of solvent selection.

In another embodiment, the ink can be any one of the following formulations:

three laser dyes, namely symmetrical diphenylethylene, fluorescein sodium and rhodamine B, are added into a BSA aqueous solution of 300-1000 mg/mL respectively, in which a mass ratio of one of the three dyes to BSA are 1-3%, respectively, and then glycerol is added. A volume ratio of glycerol to water is 1:1-4, preferably 1:2;

more preferable, the ink can be any one of the following formulations:

(1) three laser dyes, namely symmetrical diphenylethylene, fluorescein sodium and rhodamine B, are added into a BSA aqueous solution of 400 mg/mL, respectively, in which a mass ratio of one of the three dyes to BSA are all 1%. Finally, glycerol is added, in which a volume ratio of glycerol to water is 1:2;

(2) three laser dyes, namely symmetrical diphenylethylene, fluorescein sodium and rhodamine B, are added into a BSA aqueous solution of 800 mg/mL, respectively, in which a mass ratios of one of the three dyes to BSA are all 1%. Finally, glycerol is added, in which a volume ratio of glycerol to water is 1:2;

(3) three laser dyes, namely symmetrical diphenylethylene, fluorescein sodium and rhodamine B, are added into a BSA aqueous solution of 500 mg/mL, respectively, in which a mass ratio of diphenylethylene, fluorescein sodium and rhodamine B to BSA are 2%, 2%, and 1%, respectively. Finally, glycerol is added, in which a volume ratio of glycerol to water is 1:2.

(4) In addition to the dosage of the above specific formulations, there are still many choices, of which the concentration range of BSA aqueous solution is 300-1000 mg/mL. The mass ratios of rhodamine B, fluorescein sodium and symmetrical diphenylethylene to BSA are 1%-2%, 1%-3% and 1%-3%, respectively. The volume ratio of glycerol to water is 30%-100%.

In another embodiment, when the above formulations (1) to (3) is used, the laser sources are excited by 335-375 nm femtosecond lasers to emit light. As previously described, the wavelength of the femtosecond laser is determined by the absorption spectrum of the light source formed after the ink is cured.

For the above related embodiment, the matrix material is selected from Bovine Serum Albumin (i.e., BSA).

In another embodiment, the certain scale comprises any one of the following: millimeter, micrometer or even smaller.

For the embodiment, the smaller the scale of each light source, the more favorable it is to achieve the higherresolution image display effects. If any one of the light sources is regarded as a micro-hemisphere structure, according to the requirement of resolution, we can produce a micro-hemisphere structure with a size corresponding to the resolution. The size of the micro-hemisphere structure of any one of the light sources may be 15, 35, 45, 85, 100 microns, etc., or even smaller. If the size of the micro-hemisphere structure of any one of the light sources is in the order of millimeters, it is suitable for outdoor large screen display technology.

As can be seen, the optical mode of the micro-hemisphere structure is an echo wall mode. For the different size of the micro-hemisphere structure, the mode spacing is different. According to the theory of the echo wall mode, the smaller the hemisphere diameter is, the larger the mode spacing is, and the less number of modes exist in the gain region. When the number of modes is reduced to one, it is a single-mode laser.

Furthermore, when the hemisphere diameter of the micro-hemisphere structure corresponding to a light source is small to a specific size, and there is a corresponding relationship with the single-mode laser excited by the light source, which can further increase the gamut range of laser. Illustratively rather than restrictively, the specific size is about 15 microns.

In another embodiment, a set of laser source modules including RGB three light sources can be produced with ink. Understandably, it is easy to mix colors according to the principle of RGB three primary colors. Referring to the previous text, if a femtosecond laser is used for exciting and mixing colors, the femtosecond laser should be able to excite all RGB three light sources at the same time, so as to use the principle of three primary colors to mix colors to obtain various colors. Similarly, if DC voltage is used for exciting, more precise control can be achieved: the RGB three light sources can control their voltages individually, thus the three primary colors can be used to mix colors to obtain various colors.

In another embodiment, the auxiliary material comprises liquid prepolymer. For the prepolymer, it is solidified only after light or heat treatment In another embodiment, the auxiliary material comprises any one of the following: heat curable epoxy resins, NOA series of light curable adhesives. It responds to the previous description of the auxiliary material.

As can be seen, the light sources through inkjet printing are all printed with ink. If the plural light sources are printed, the plural light sources are often microspherical, specifically hemispherical.

In the process of fabricating the light sources, the ink used for inkjet printing is liquid, and the fabricated light sources are finally solid, so in the process of inkjet printing, generally, each light source should not contact each other to avoid merging with each other.

In other words, each light source is often not in contact with each other, and there is space between them; if each light source is understood as a hemisphere, for the plural light sources, the first hemisphere and the second hemisphere (even the third hemisphere, etc.) are not tangent to each other.

In another embodiment, the fabricated laser source can combine into multiple independent laser source modules;

in each set of the multiple independent laser source modules, at least two of the light sources are capable of emitting light in different colors under same excitation conditions.

It can be understood that, during color mixing in at least two light sources, optionally, the at least two light sources are excited by a femtosecond laser, and only a femtosecond laser is used, then the femtosecond laser should be able to excite the at least two light sources at a same time. Thus, because at least two of the plural light sources are capable of emitting light in different colors under same excitation conditions, it is assumed that the plural light sources are a group of light source modules, such as the three are a group shown in FIG. 1. Then, the color mixing in each set of laser source modules can be realized by the technique of the present invention. Color mixing is very significant, for example, a variety of different colors can be obtained by mixing colors according to the RGB three primary colors.

In particular, the present invention allows that at least two of the plural light sources are capable of emitting light in the same color under the same excitation conditions. For example, to obtain a strong light of a certain single color, the plural light sources in each set of the laser source modules may also be the same light source, which can emit light in the same color under the same excitation conditions. The laser source modules can be used in the field of searchlights.

As noted above, in another embodiment, each set of the laser source modules excites the plural light sources by a femtosecond laser. The femtosecond laser is further described with the following related content.

As can be seen, the parameters of the specific femtosecond laser, such as wavelength, are determined by the light sources themselves formed after the above ink is cured. Being excited by the laser is inevitably related to the absorption spectra of the light sources themselves formed after the ink is solidified, i.e., the wavelength herein is determined by the absorption spectra of the light sources formed after the ink is cured.

It is assumed that each set of the laser source modules comprises three light sources, each of which is fabricated through inkjet printing with a specific laser dye, so that: when the three light sources produced with the three dyes can be excited by the same wavelength of laser to emit light, those skilled in the art can choose a laser with this wavelength as the excitation condition; certainly, this does not exclude using a two- or three-wavelength laser as excitation conditions; that is, the wavelength of laser used for excitation can be flexibly selected that: it is possible to select one laser, two lasers or three lasers to excite each set of the laser source modules, and the wavelength of each laser is determined by the absorption spectra of the light sources is cured. In particular, it is different from the prior art, in which multiple light beams in different colors are used for scanning illumination and image display, that the present invention only needs to use a laser to excite the light sources.

In another embodiment, the light source can be excited by a DC voltage.

For the embodiment, it reveals another excitation way. Certainly, whether it is excited by a femtosecond laser, or a DC voltage, it depends on the light sources themselves formed after the ink is cured. In other words, the laser dyes obviously have characteristic of being able to be excited by a certain DC voltage, for example, the DC voltage is about 3V.

In another embodiment, when the light sources are used for displaying an image, the light emitted by each set of the excited laser source modules (ie, including a plural laser sources) corresponds to one pixel of the image.

For the embodiment, it means that each set of the laser source modules is in pixel level. It is beneficial for achieving finer image display and promoting the application of laser technology in the field of high definition and super definition displays.

In another embodiment, when a DC voltage excitation mode is used, each set of the laser source modules can be driven by thin-film transistors or by other thin-film transistors: for example, oxide semiconductor thin-film transistors, polycrystalline silicon thin-film transistors, amorphous silicon thin-film transistors. Compared with the excitation mode by one or more femtosecond lasers, the DC voltage excitation mode can control each pixel individually, and even simultaneously, which is very beneficial for a pixel-level laser source device. Incidentally, the excitation mode can also significantly reduce the volume of equipment in the field of laser displays.

In another embodiment, the space between the laser sources is about 2.5-4 times their diameters.

It is easy to understand that the space here can be changed according to the requirements of the light sources.

In another embodiment, the temperature and time during curing are determined by the inherent characteristics of ink. For example, BSA aqueous system and polystyrene/dichloromethane system are heated at 60 degrees Celsius for one hour, while NOA series materials can be irradiated by ultraviolet light for several minutes.

Preferably, for each group of RGB three primary color light sources, the diameters of the three primary color light sources are basically the same and are located at three vertices of an equilateral triangle, respectively, and the length of the equilateral triangle exceed 10%-30% of the diameters.

In another embodiment, the inkjet printing may use one or multiple printheads, the printheads are used for sequentially printing, or printing multiple light sources of each set of laser source modules at a time.

Figure 2:
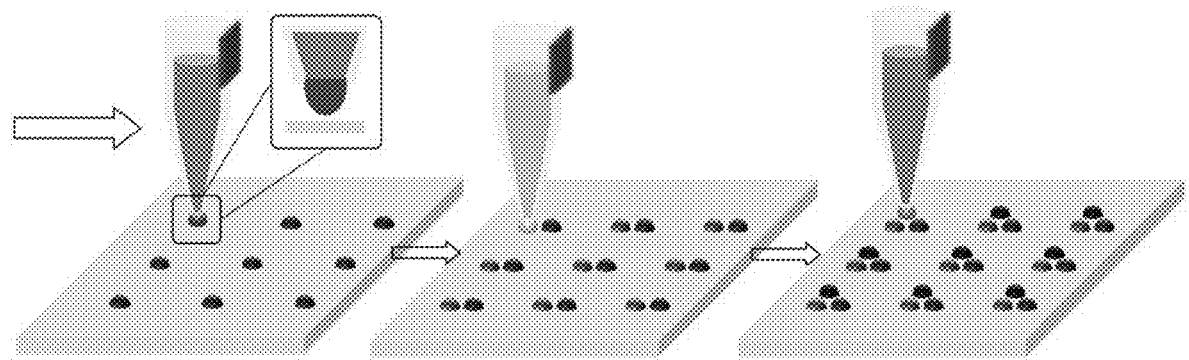
FIG. 2 is a schematic view of the inkjet printing process in an embodiment of the present invention.
Figure 3:
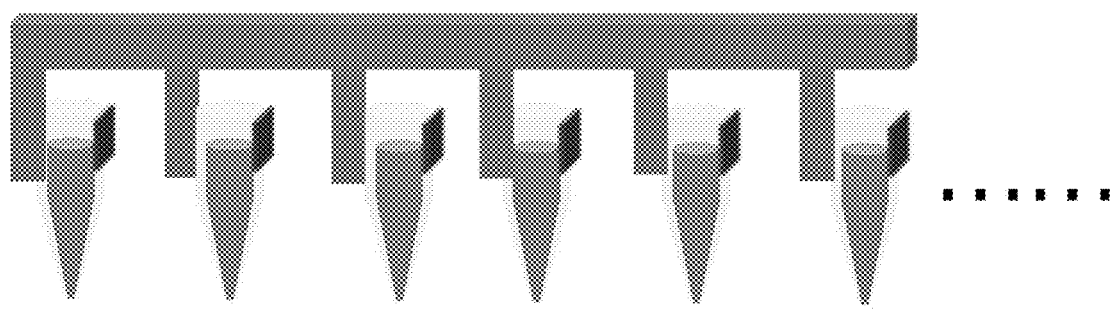
FIG. 3 is another schematic view of the inkjet printing process in an embodiment of the present invention.

For the embodiment, referring to FIG. 2, when using one printhead, the printhead prints each light source in each set of the laser source modules sequentially, for instance, successively printing three light sources, red, green and blue in the order of R, G and B; when using multiple printheads, each light source in each set of the laser source modules can be printed at one time by the multiple printheads—understandably, the number of the printheads in work should be larger than or equal to the number of the light sources in each set of the laser source modules, for example, larger than or equal to the number of RGB three light sources. FIG. 3 only shows multiple printheads for a certain light source, such as multiple printheads for a red light source, and other light sources for the plural light sources are not shown.

In another embodiment, the size of the printheads is determined by the size of each light source.

As can be seen, the size of the printheads is related to the hemisphere diameter of the above-described micro-hemisphere structure and is determined by the hemisphere diameter. The size of the printheads can be selected in a range of 5, 10, 20, 30, 40, 50, 60 microns, etc. If it is necessary to produce a micro-hemisphere structure smaller than micron-scale, when the size of the printheads cannot be smaller, an inkjet printer capable of adjusting the size of ink droplets can be used and adaptively slightly improved to produce the light sources of the present invention through inkjet printing.

As mentioned earlier, if a millimeter-scale micro-hemisphere structure is to be obtained, the size of the printheads can be appropriately larger.

An inkjet printer capable of adjusting the size of ink droplets can refer to the following patent documents in the prior art: CN1876375 A, U.S. Pat. No. 8,042,899 B2, U.S. Pat. No. 8,714,692 B1, U.S. Pat. No. 8,955,937 B2, U.S. Pat. No. 8,985,723 B2, U.S. Pat. No. 9,573,382 B1. These patent documents are here introduced in the description of the present invention, but it should be pointed out that these are only part of the related technologies of inkjet printers in the prior art. Since it is impossible to exhaust all technologies in the prior art, the remaining existing technologies that can be referred to and slightly improved are not listed.

In the above embodiments, the description of every embodiment has its own focus, and the parts that are not detailed in some embodiment can be referred to the related descriptions of other embodiments.

As described above, the above embodiments are only used to illustrate the technical solutions of the present invention, rather than limiting the present invention; although the present invention is described in detail with reference to the above embodiments, it should be understood for those skilled in the art that the technical solutions described in the embodiments can be modified, or some of the technical features can be equivalently alternated; and the modifications or equivalents do not make the essence of the corresponding technical solutions depart from the scope of the technical solutions of every embodiment of the present invention.

The invention claimed is:

1. An ink for producing a laser source comprising:
a bovine serum albumin (BSA) aqueous solution, glycerol, a matrix material, a solvent, and a luminescent dye selected from symmetrical diphenylethylene, fluorescein sodium, and rhodamine B,
wherein a concentration of BSA in the BSA aqueous solution is 300-1000 mg/mL, a mass ratio of the luminescent dye to BSA is 1-3%, and a volume ratio of glycerol to water is 1:1-4, and wherein the ink forms the laser source through inkjet printing.

2. The ink according to claim 1, wherein the light source is a source for red light, green light, or blue light source.

3. The ink according to claim 1, wherein the matrix material is selected from polystyrene, polymethyl methacrylate, a UV-curable materials, and mixtures thereof.

4. The ink according to claim 1, wherein the solvent is selected from dichloromethane, chloroform, dimethylformamide, and mixtures thereof.

5. The ink according to claim 1, wherein the concentration of BSA in the BSA aqueous solution is 400 mg/mL, the mass ratio of the luminescent dye to BSA is 1%, and the volume ratio of glycerol to water is 1:2.

6. The ink according to claim 1, wherein a size of the laser source is millimeter or micrometer.

7. A laser source module, comprising at least two different light sources of claim 1, wherein the at least two different light sources are selected from selected from the light source comprising symmetrical diphenylethylene, the light source comprising fluorescein sodium, and the light source comprising rhodamine B, wherein the at least two different light sources are configured to emit light of different color under a same excitation condition.

8. The ink according to claim 1, further comprising a liquid prepolymer.

9. The ink according to claim 1, wherein the concentration of BSA in the BSA aqueous solution is 800 mg/mL, the mass ratio of the luminescent dye to BSA is 1%, and the volume ratio of glycerol to water is 1:2.

10. The ink according to claim 1, wherein the concentration of BSA in the BSA aqueous solution is 500 mg/mL, the mass ratio of symmetrical diphenylethylene to BSA is 2%, and the volume ratio of glycerol to water is 1:2.

11. The ink according to claim 1, wherein the concentration of BSA in the BSA aqueous solution is 500 mg/mL, the mass ratio of fluorescein sodium to BSA is 2%, and the volume ratio of glycerol to water is 1:2.

12. The ink according to claim 1, wherein the concentration of BSA in the BSA aqueous solution is 500 mg/mL, the mass ratio of rhodamine B to BSA is 1%, and the volume ratio of glycerol to water is 1:2.

* * * * *